United States Patent
Godet et al.

(10) Patent No.: US 9,024,273 B2
(45) Date of Patent: May 5, 2015

(54) METHOD TO GENERATE MOLECULAR IONS FROM IONS WITH A SMALLER ATOMIC MASS

(75) Inventors: Ludovic Godet, North Reading, MA (US); Svetlana Radovanov, Marblehead, MA (US); Christopher R. Hatem, Salisbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 640 days.

(21) Appl. No.: 12/763,652

(22) Filed: Apr. 20, 2010

(65) Prior Publication Data

US 2011/0253902 A1 Oct. 20, 2011

(51) Int. Cl.
*H01J 37/08* (2006.01)
*H01J 37/317* (2006.01)

(52) U.S. Cl.
CPC ............ *H01J 37/3171* (2013.01); *H01J 37/08* (2013.01)

(58) Field of Classification Search
USPC ......... 250/423 R, 424, 425, 426; 315/111.81, 315/111.91
See application file for complete search history.

(56) References Cited

U.S. PATENT DOCUMENTS

| | | | |
|---|---|---|---|
| 4,609,428 A * | 9/1986 | Fujimura | 438/728 |
| 5,107,170 A | 4/1992 | Ishikawa et al. | |
| 5,313,067 A * | 5/1994 | Houk et al. | 250/492.21 |
| 5,741,821 A * | 4/1998 | Roufogalis et al. | 514/649 |
| 5,751,002 A * | 5/1998 | Ogata et al. | 250/492.21 |
| 5,997,687 A * | 12/1999 | Koshimizu | 156/345.44 |
| 6,319,369 B1 * | 11/2001 | Flynn et al. | 204/192.38 |
| 6,465,793 B1 * | 10/2002 | Anders | 250/426 |
| 6,878,930 B1 * | 4/2005 | Willoughby et al. | 250/281 |
| 7,666,771 B2 | 2/2010 | Krull et al. | |
| 7,700,925 B2 | 4/2010 | Radovanov et al. | |
| 7,834,554 B2 | 11/2010 | Horsky | |
| 8,330,118 B2 | 12/2012 | Horsky et al. | |
| 2002/0036263 A1 * | 3/2002 | Shiokawa et al. | 250/288 |
| 2002/0074226 A1 * | 6/2002 | Murakami et al. | 204/298.41 |
| 2004/0002202 A1 | 1/2004 | Horsky et al. | |
| 2005/0199823 A1 * | 9/2005 | Franzen | 250/425 |
| 2006/0124847 A1 * | 6/2006 | Kato | 250/288 |
| 2007/0105325 A1 | 5/2007 | Horsky et al. | |
| 2007/0178678 A1 | 8/2007 | Hatem et al. | |

(Continued)

FOREIGN PATENT DOCUMENTS

CN 101681782 A 3/2010
GB 2415290 A 12/2005

(Continued)

OTHER PUBLICATIONS

J.H. Gross, Methane Reagent Gas Plasma, Mass Spectrometry—A Textbook, 2011, p. 355, Springer, Heidelberg.

(Continued)

*Primary Examiner* — Brooke Purinton

(57) ABSTRACT

An apparatus that generates molecular ions and methods to generate molecular ions are disclosed. At least a first species is ionized in an ion source. The first species ions and/or first species combine to form molecular ions. These molecular ions may be transported to a second chamber, which may be an arc chamber or diffusion chamber, and are extracted. The molecular ions may have a larger atomic mass than the first species or first species ions. A second species also may be ionized with the first species to form molecular ions. In one instance, the first and second species are both molecules.

5 Claims, 7 Drawing Sheets

(56) References Cited

U.S. PATENT DOCUMENTS

| | | | |
|---|---|---|---|
| 2008/0087816 A1* | 4/2008 | McCauley et al. | 250/287 |
| 2008/0182382 A1* | 7/2008 | Ingle et al. | 438/435 |
| 2009/0039250 A1* | 2/2009 | Ishimaru et al. | 250/288 |
| 2009/0166554 A1 | 7/2009 | Radovanov et al. | |
| 2009/0200494 A1 | 8/2009 | Hatem et al. | |
| 2010/0084577 A1 | 4/2010 | Hatem et al. | |

FOREIGN PATENT DOCUMENTS

| | | |
|---|---|---|
| GB | 246190 A | 2/2010 |
| WO | 2004006286 A1 | 1/2004 |

OTHER PUBLICATIONS

Josep Arno, "Report on in-Situ antimony fluoride generation for ion implant processes," 2002, 14th International Conference on Ion Implantation Technology Proceedings, pp. 452-454, 0-7803-7155-0, IEEE.

Atsushi Suzuki & Hidehiko Nonaka, "In situ measurement of gas composition changes in radio frequency plasma using a quartz sensor," 2009, Rev. of Sci. Instr., 095109-1 to 095109-9, vol. 80, American Institute of Physics.

Nobuki Mutsukura & Kazuhiko Saitoh, "Temperature dependence of a-C:H film deposition in a CH4 radio frequency plasma," 1996, J. Vac. Sci. Tech. A, pp. 2666-2668, 14(4), American Vacuum Society.

* cited by examiner

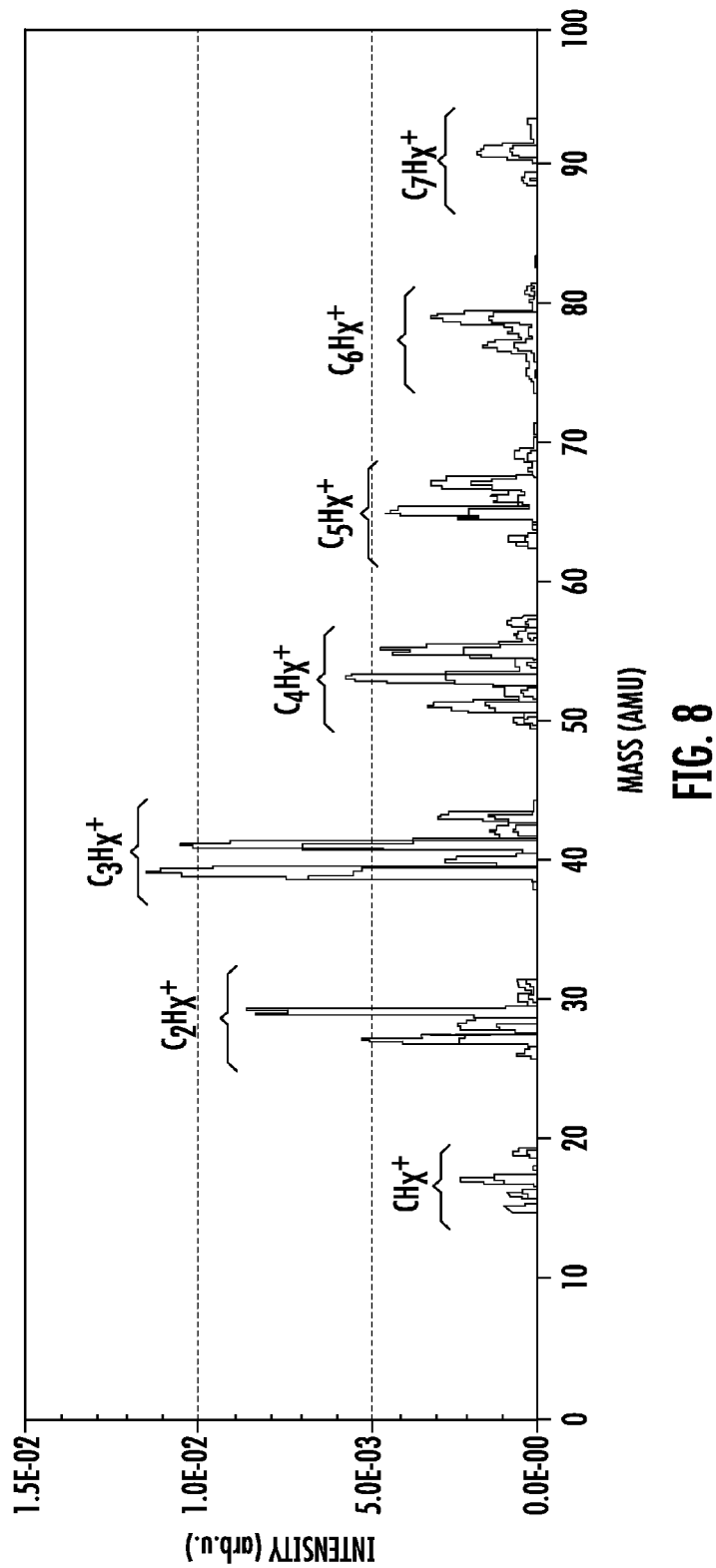

METHOD TO GENERATE MOLECULAR IONS FROM IONS WITH A SMALLER ATOMIC MASS

FIELD

This invention relates to the formation of ions and, more particularly, to the formation of molecular ions.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Molecular ion beams may be more easily transported at a higher energy and lower beam current than atomic ion beams. The atoms (including dopant species) in a molecular ion share an overall kinetic energy of the molecular ion according to their respective atomic masses. Furthermore, by having fewer ions implanted to obtain the same dose, any space charge effect in the ion beam and, consequently, beam "blow up" may be minimized.

Molecular ions, however, may be difficult to form and maintain during the ionization or implantation process. Use of an ion source, such as an indirectly heated cathode (IHC) or Bernas source, tends to break up molecules into atomic ions. For example, dopant molecules like $BF_3$, $PH_3$, $PF_5$, $AsH_3$, $B_2H_4$, or $GeF_5$ tend to dissociate easily in the thermal plasmas formed using an IHC or Bernas source. Thus, atomic ions may be formed instead of molecular ions. A plasma doping system that generates a plasma of ions and neutrals and biases a workpiece for implantation may not adequately control electron temperature or other plasma conditions such as pressure, power, frequency, or gas flow to form molecular ions. Thus, molecular ions may dissociate within a high voltage sheath of such a plasma doping system. This may be due to the pressure inside the high voltage sheath. So, for example, $BF_3$ may only survive as $B^+$ ions after crossing the high voltage sheath and implanting a workpiece. Additionally, as the molecular ions increase in molecular weight, it may become more difficult to not dissociate these molecular ions into atomic ions or smaller molecular ions in a conventional ion source. Other ion source systems may have lifetime issues due to depositions on components of the ion source caused by molecular ion formation. Use of certain dopants may cause deposits of, for example, B, C, As, or P to build up on surfaces within the ion source. Accordingly, there is a need in the art for an improved method of forming molecular ions.

SUMMARY

According to a first aspect of the invention, a method to generate molecular ions is provided. The method comprises introducing a first species into an ion source. First species ions are formed from the first species. Molecular ions are formed using the first species ions. The molecular ions have a larger atomic mass than an atomic mass of the first species ions. The molecular ions are transported from the ion source to a second chamber and are extracted from the second chamber.

According to a second aspect of the invention, a method to generate molecular ions is provided. The method comprises introducing a first gas and a second gas into an ion source. The first gas and the second gas are ionized to form first gas ions and second gas ions. The first gas ions and the second gas ions are combined to form molecular ions. The molecular ions are transported from the ion source to a second chamber and are extracted from the second chamber.

According to a third aspect of the invention, a method to generate molecular ions is provided. The method comprises ionizing an alkane species having a formula $C_aH_b$ in an RF ion source. Molecular ions of the formula $C_xH_y$, wherein x>a, are generated in the RF ion source from the alkane species. The molecular ions are extracted from the RF ion source and are implanted into a workpiece.

BRIEF DESCRIPTION OF THE DRAWINGS

For a better understanding of the present disclosure, reference is made to the accompanying drawings, which are incorporated herein by reference and in which:

FIG. 8 is molecular ion formation from $CH_4$ using an embodiment disclosed herein.

DETAILED DESCRIPTION

These embodiments are described herein in connection with an ion implanter. However, the various embodiments can be used with other systems and processes involved in semiconductor manufacturing or other systems that use ions. Thus, the invention is not limited to the specific embodiments described below.

Figure 1:
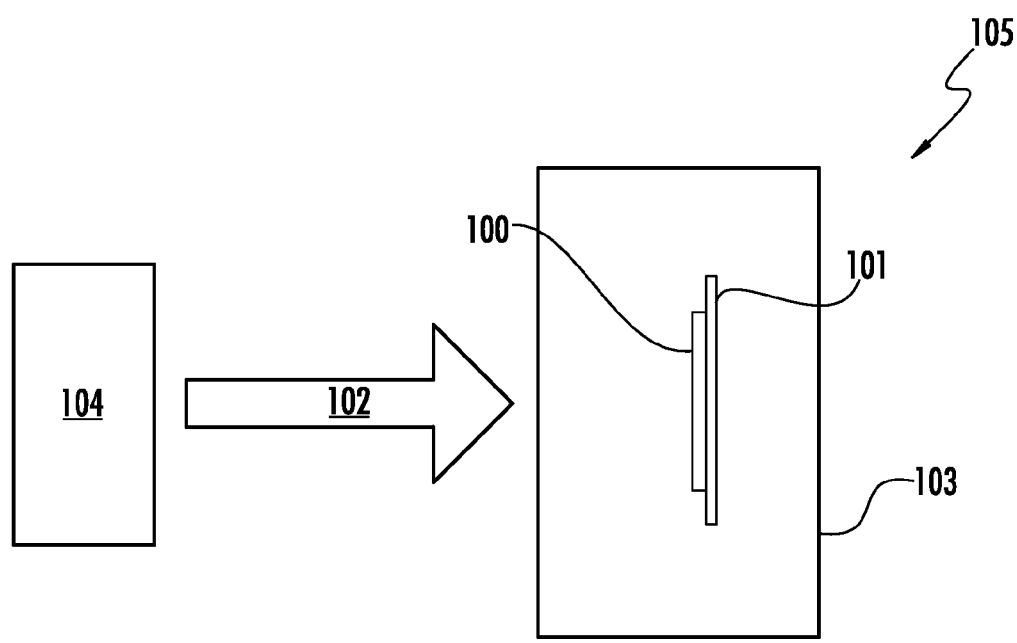
FIG. 1 is a block diagram of a beamline ion implanter.

FIG. 1 is a block diagram of a beamline ion implanter. Those skilled in the art will recognize that the beamline ion implanter 105 is only one of many examples of beamline ion implanters that can provide ions. In general, the beamline ion implanter 105 includes an ion source 104 to generate ions that are extracted to form an ion beam 102, which may be, for example, a ribbon beam or a spot beam. The ion beam 102 may be mass analyzed and converted from a diverging ion beam to a ribbon ion beam with substantially parallel ion trajectories in one instance. In another embodiment, the ion beam 102 is not mass analyzed. The beamline ion implanter 105 may further include an acceleration or deceleration unit in some embodiments.

An end station 103 supports one or more workpieces, such as workpiece 100, in the path of the ion beam 102 such that ions of the desired species are implanted into workpiece 100. The workpiece 100 may be, for example, a semiconductor wafer, a solar cell, a flat panel, a light-emitting diode (LED), or some other workpiece known to those skilled in the art. The end station 103 may include a platen 101 to support the workpiece 100. The end station 103 also may include in one embodiment a scanner for moving the workpiece 100 perpendicular to the long dimension of the ion beam 102 cross-section, thereby distributing ions over the entire surface of workpiece 100. The ion implanter 105 may include additional components known to those skilled in the art such as automated workpiece handling equipment, Faraday sensors, or an electron flood gun. It will be understood to those skilled in the art that the entire path traversed by the ion beam 102 is evacuated during ion implantation. The beamline ion implanter 105 may incorporate hot or cold implantation of ions in some embodiments.

While the beamline ion implanter 105 is specifically illustrated, the embodiments described herein may be applied to other ion implanters or plasma processing systems. For example, a plasma doping tool (such as one that biases the workpiece to implant), plasma immersion tool, flood implanter, focused ion beam tool, or plasma-enhanced chemical vapor deposition (PECVD) system may benefit from the embodiments disclosed herein.

Figure 2:
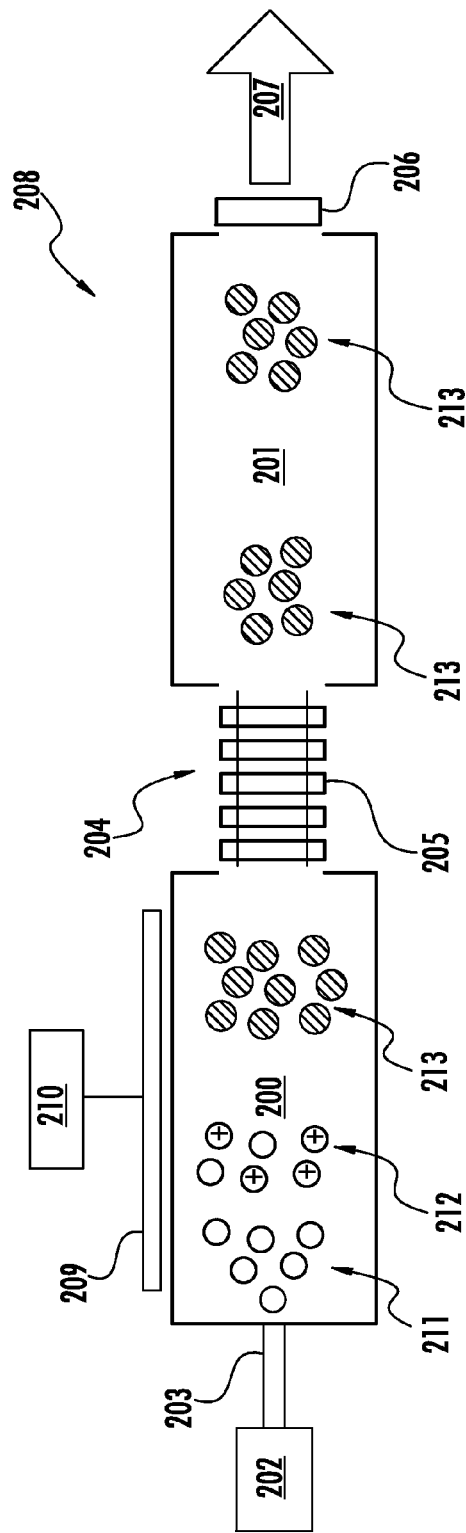
FIG. 2 is a block diagram of a first embodiment of an ion source.

FIG. 2 is a block diagram of a first embodiment of an ion source. The ion source 208, which may correspond to the ion source 104 of FIG. 1, in one instance may have multiple modes of operation and includes a first ion source 200. This first ion source 200 has a gas source 202 connected by a gas feed 203. The gas source 202 may be, for example, a gas bottle or vaporizer.

The gas source 202 may supply a first species 211 such as $CH_4$, $C_2H_4$, another alkane, $B_2H_6$, $CO_2$, $C_2F_4$, $BF_3$, $AsH_3$, $PH_3$, $GeH_4$, $GeF_4$, $PI_3$, $AsI_3$, $N_2$, $NH_3$, or other species known to those skilled in the art. This first species 211 is a molecule in one particular embodiment. In an alternate embodiment, an alkane of the formula $C_aH_b$ is supplied. The first species 211 also may have the formula $P_xH_y$, $C_xF_y$, $Al_xCl_y$, $Ge_xH_y$, or $Ge_xF_y$ wherein x and y are greater than zero. Other organometallic molecules known to those skilled in the art also may be used as a first species 211.

The first ion source 200 may be, for example, an RF or DC pulsed ion source. An antenna 209 resonates RF or DC currents from the power source 210. In one instance, the antenna 209 is attached to an RF matching network. The power supply 210 may be either an RF or DC power supply. This produces as oscillating magnetic field that induces RF or DC currents within the first ion source 200. The RF or DC currents in the first ion source 200 excite and ionize a fraction of the first species 211 to form first species ions 212 (illustrated by the positive sign in FIG. 2). The first ion source 200 may be floating or biased. The first ion source 200 in an alternate embodiment may have an immersed RF antenna or may be an electron cyclotron resonance (ECR) or microwave ion source.

In one particular embodiment, the first ion source 200 is a multi-set point RF ion source. A multi-set point RF ion source enables RF power to be modulated as a function of time. Such an RF source may be coupled to a power supply that can pulse. RF frequency, power, or duty cycle may be modified using such an ion source. This may be used to balance any reactions within the first ion source 200. For example, by using a short and high RF power, higher density plasma may be formed within the first ion source 200 and more electrons are available to remove any charge accumulation. In yet another example, reducing the duty cycle may reduce any deposition or etching within the first ion source 200.

A bipolar bias supply may be used to extract electrons or positive ions at certain energies during different periods of the RF pulsing in one embodiment. A positive bias will attract negative ions while a negative bias will attract positive ions.

The ion source 200 will ionize a portion of the first species 211 to form first species ions 212. The first species ions 212 may be charged either positively or negatively. Molecular ions 213 (darkened in FIG. 2) are formed from the first species ions 212 and/or first species 211. For example, a first species 211 and a first species ion 212 may combine to form a molecular ion 213. Two first species ions 212 also may combine to form a molecular ion 213. A certain plasma energy may be required to cause this reaction. The collisions that form the molecular ions 213 occur in the gas phase. An associative ionization collision between two first species 211 molecules or a first species 211 molecule and a first species ion 212 may be one mechanism that causes the formation of the molecular ions 213, but other mechanisms are possible. In another instance, molecular ions 213 may be created from two body or three body recombination when, for example, a first species 211 molecule or some atom formed during ionization reacts with a first species ion 212. These mechanisms may occur in the plasma or on a surface of the first ion source 200.

The molecular ions 213 may be, for example, $C_xH_y$, $B_xH_y$, $B_xF_y$, or $As_xH_y$, $P_xH_y$, $C_xF_y$, $Al_xCl_y$, $Ge_xH_y$, or $Ge_xF_y$ wherein x and y are greater than zero. These molecular ions 213 have a larger atomic mass than the first species 211 or first species ions 212. In one particular embodiment, the first species 211 is an alkane with the formula $C_aH_b$. The molecular ions 213 are an alkane with the formula $C_xH_y$. In this instance x>a. Thus, a larger alkane molecular ion may be generated from smaller alkane molecular ions. In another particular embodiment, $BF_3$ is the first species 211 and the molecular ions 213 formed may be $B_2F_3^+$, $B_2F_4^+$, or $B_2F_5^+$. Modulating plasma parameters such as power, frequency, duty cycle, pressure, or gas flow can increase generation or retention of molecular ions 213 and, consequently, may increase formation of the molecular ions 213.

The first ion source 200 may operate in a pulse mode to enhance the fraction of molecular ions 213 formed. For example, pulsing the first ion source 200 may enhance the recombination of the first species ions 212 and/or first species 211 by controlling the average electron temperature. This is the temperature of a group of electrons that have velocities following the Maxwell-Boltzmann distribution or a percentage of an average energy of such a group of electrons. Pulsing the first ion source 200 allows parameters of the plasma or ions, such as ion and electron density, electron temperature, or plasma potential, to be changed. Such changes will affect whether certain reactions occur and form molecular ions 213. Changing electron temperature may enable reactions that form the molecular ions 213 or a desired molecular ion 213. For example, a lower electron temperature can increase attachment and recombination that form the molecular ions 213. In another example, lower electron temperature may enable recombination of particular molecular ions 213 with a neutral molecule, such as a background gas or first species 211, to enlarge the molecular ion 213. Pulsing the first ion source 200 also can modify the first species ion 212 formed. For example, with $BF_3$ as a first species 211, a higher energy is required to form $B^+$ ions as a first species ion 212 than $BF_2^+$. In one instance, 30 eV is required to form $B^+$ while 16 eV is required to form $BF_2^+$.

The duty cycle of the pulse also may be optimized for the first species 211. Each particular molecule used as a first species 211 has a particular optimal duty cycle to increase generation of the molecular ions 213. By changing the duty cycle, the occurrence of particular reactions that form a molecular ion 213 is modified. Each reaction requires a different energy or amount of time to occur. For example, a heavier molecular ion 213 may be created during an afterglow period but may be destroyed when the first species 211 is being ionized. Therefore, the duty cycle may be adjusted such that the formation rate of the molecular ion 213 is higher than the dissociation rate.

The molecular ions 213 formed in the first ion source 200 are transported to a second chamber 201 using a plasma pipe 204. The plasma pipe 204 has a plurality of ring magnets 205. The ring magnets 205 may form a multi-cusp arrangement to provide optimal plasma or ion confinement. These ring magnets 205 may be aluminum-coated to prevent contamination. In an alternate embodiment, the plasma pipe 204 uses solenoids. The solenoids provide plasma confinement and, in one particular embodiment, may provide variable confinement because the driving current to the solenoid may be adjusted. Extraction optics may be located between the first ion source 200 and the plasma pipe 204 or between the plasma pipe 204 and the second chamber 201 to extract the molecular ions 213. An Einzel lens may be used in one embodiment.

The second chamber 201 may be a diffusion chamber or an arc chamber. This arc chamber may be part of an existing ion implanter and may contain, for example, an IHC or Bernas ion source. This arc chamber may or may not be operating while the molecular ions 213 are transported to the second chamber 201. In one embodiment, surfaces within the second chamber 201 may be coated with a catalyst that prevents dissociation of the molecular ions 213 on these surfaces.

In one embodiment, the second chamber 201 is an arc chamber and has a separate gas feed. Thus, the ion source 208 can operate in both a "hot" and "cold" mode of operation and can provide a wide range of atomic and molecular ions. For example, $BF_3$ may be supplied to the arc chamber to generate $B^+$ ions in "hot" mode while the first ion source 200 provides molecular ions 213 in "cold" mode. Thus, portions of the ion source 208 may be retrofitted onto an existing ion source.

The molecular ions 213 are then extracted from the second chamber 201 as the molecular ions 207. The molecular ions 207 may be an ion beam, such as the ion beam 102 seen in FIG. 1. The molecular ions 207 may be extracted at a low pressure to minimize dissociation into atomic ions. This extraction may use extraction optics 206, which in one particular embodiment is an Einzel lens. The molecular ions 207 may or may not be subsequently mass analyzed. Thus, the ion source 208 may be used in plasma doping, plasma immersion, flood implant, or sheath modulation tools.

The pressure in the second chamber 201 may be lower than the pressure in the first ion source 200. A gradient of pressure may occur in the plasma pipe 204 going from the higher pressure in the first ion source 200 to the lower pressure in the second chamber 201. The pressure in, for example, a beamline ion implanter 105 illustrated in FIG. 1 or elsewhere that the molecular ions 207 are extracted may be lower than the pressure in the second chamber 201. Valves between the first ion source 200, second chamber 201, and plasma pipe 204 may enable pressure control. A lower pressure within a region of the ion source 208 will reduce collisions between, for example, the molecular ions 213. A lower collision probability will reduce dissociation of the molecular ions 213.

The temperature of the first ion source 200, second chamber 201, and plasma pipe 204 may be controlled to reduce or control deposition on the surfaces of the ion source 208. For example, reducing the temperature may reduce deposition of B from $B_2H_4$ ions. However, increasing the temperature may reduce deposits of $BF_x$ from $BF_3$ ions or $CF_x$ from $C_2F_4$ ions. Heaters and cooling pipes or cooling jackets may be used in one instance.

Control of the temperature also may enhance formation and retention of the molecular ions 213. High temperatures may cause the molecular ions 213 to dissociate. The temperature of the first ion source 200, second chamber 201, and plasma pipe 204 may be controlled in some embodiments using active cooling, such as water or fluid pipes within the walls of these systems.

The second chamber 201 may have a second gas feed. A gas may be supplied to the second chamber 201 to control pressure or clean the surfaces of the second chamber 201. For example, $NF_3$, Ar, $NH_3$, or a combination thereof may be used to clean the surfaces of the second chamber 201. These cleaning species may be ionized in a remote plasma source in one particular embodiment. Controlling the pressure with the second gas feed may enhance formation or retention of the molecular ions 213 in the second chamber 201. In one instance, this is at least partly because the pressure in the second chamber 201 is lower than in the first ion source 200. Use of a background gas such as He or Ar also may reduce any losses of the molecular ions 213 on the surfaces of the second chamber 201.

Figure 3:
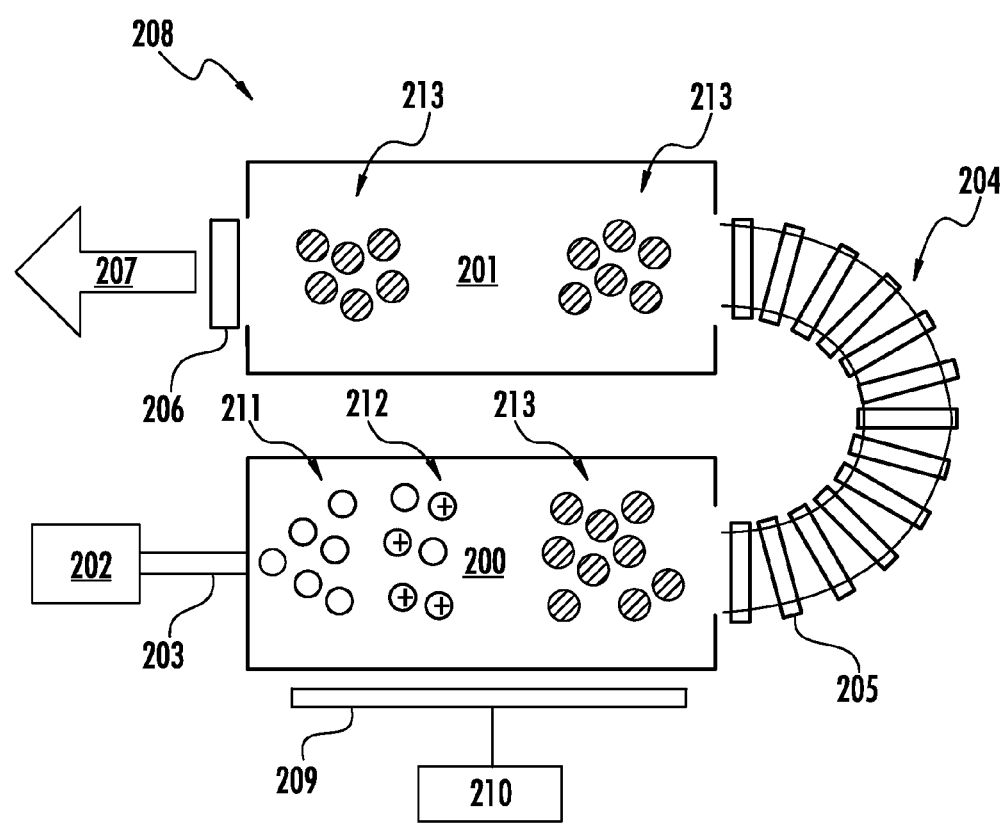
FIG. 3 is a block diagram of a second embodiment of an ion source.
Figure 6:
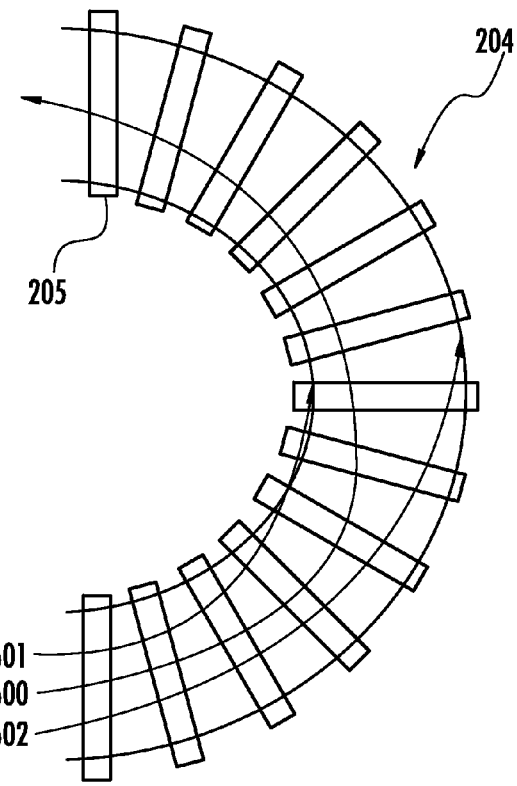
FIG. 6 is a cross-sectional view of an embodiment of an ion filter.

FIG. 3 is a block diagram of a second embodiment of an ion source. In this particular embodiment, the plasma pipe 204 is curved. The curvature of the plasma pipe 204 may enable the molecular ions 213 to be filtered within the plasma pipe 204. Transport of the molecular ions 213 or plasma may be enhanced due to magnetic confinement in the plasma pipe 204. FIG. 6 is a cross-sectional view of an embodiment of an ion filter. The ring magnets 205 may be configured so that only the desired molecular ions 213 pass to the second chamber 201 as illustrated by the path 600. Undesired molecular ions 213, first species ions 212, first species 211, or other atomic or molecular species or ions may impact the walls of the plasma pipe 204 due to the magnetic fields of the ring magnets 205 as illustrated by the paths 601, 602. Thus, ionic species, neutral particles, and undesired molecular ions may be filtered by the plasma pipe 204.

Figure 4:
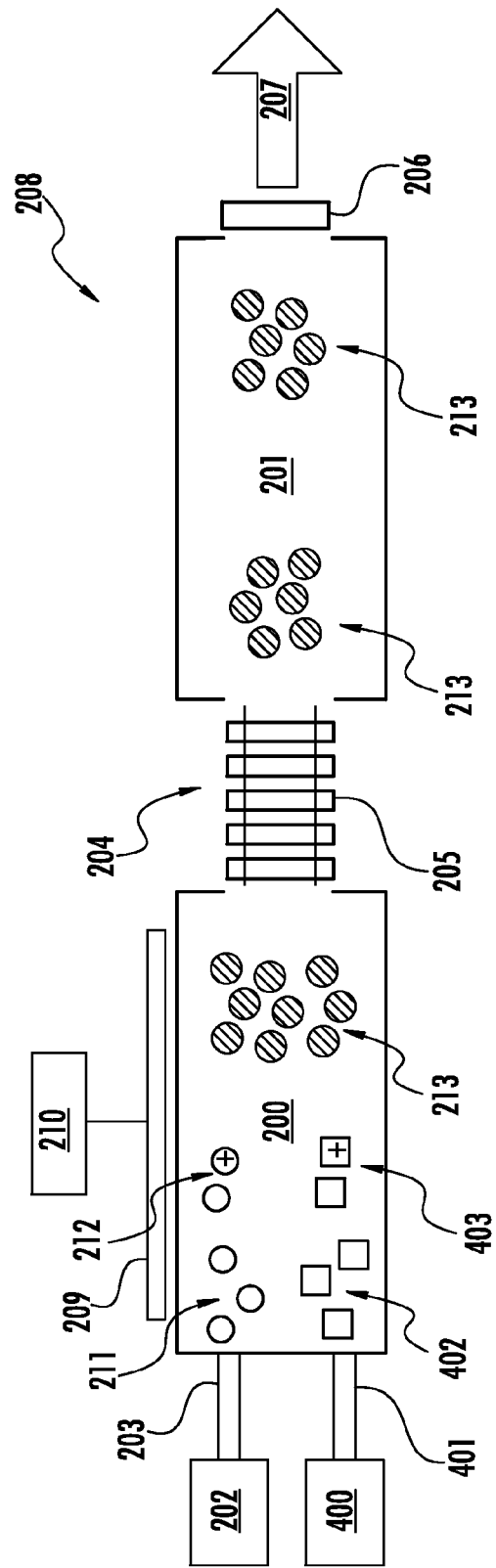
FIG. 4 is a block diagram of a third embodiment of an ion source.

FIG. 4 is a block diagram of a third embodiment of an ion source. In this particular embodiment, a second gas source 400 is connected by a second gas feed 401 to the first ion source 200. The second gas source 400 supplies a second species 402 (illustrated as squares in FIG. 4). The second species 402 is ionized to form second species ions 403 (illustrated by the positive sign in FIG. 4), which may be positive or negative. The first species 211, first species ions 212, second species 402, and/or second species ions 403 combine to form the molecular ions 213. Both the first species 211 and second species 402 are gases and may be, for example, $B_2H_6$, $CO_2$, $C_2F_4$, $BF_3$, $AsH_3$, $PH_3$, $GeH_4$, $GeF_4$, $PI_3$, $AsI_3$, $N_2$, and $NH_3$, other alkanes, or other species known to those skilled in the art. The first species 211 and second species 402 also may have the formula $P_xH_y$, $C_xF_y$, $Al_xCl_y$, $Ge_xH_y$, or $Ge_xF_y$. Other organometallic molecules known to those skilled in the art also may be used as a first species 211 or second species 402. The molecular ions 213 generated may be, for example, $P_xC_yH_z$, $P_xC_yF_z$, $P_xC_yN_z$, $B_xC_yN_z$, $B_xC_yF_z$, $B_xC_yN_z$, $As_xC_yH_z$, $As_xC_yF_z$, $As_xC_yN_z$, $Ge_xC_yH_z$, $Ge_xC_yF_z$, $Ge_xC_yN_z$, $Al_xC_yH_z$, $Al_xC_yF_z$, $Al_xC_yCl_z$, $Al_xP_yH_z$, or other molecular ions known to those skilled in the art wherein x, y, and z are greater than zero. Other molecular ions 213 also may be formed combining a metal with carbon, boron, or phosphorus. These listed formulas for the molecular ions 213 may vary as known to those skilled in the art, wherein, for example, the listed $B_xC_yH_z$ includes $C_xB_yH_z$. Of course, more than two species may be provided to form the molecular ions 213, such as an embodiment with a mixture of three or more species. In one specific embodiment, $CH_4$ and $PH_3$ are the first species 211 and second species 402. These form molecular ions 213 of $C_2PH_x^+$ or $CP_2H_x^+$ ions using an embodiment disclosed herein.

In an alternate embodiment, a first species 211 is mixed with a second species 402 in the first ion source 200 to form molecular ions 213. The second species 402 in this instance is an inert. An inert metastable atom, such as He or Ar, may help control electron temperature and may enhance formation of the molecular ions 213. In yet another embodiment, the plasma pipe 204 may be curved as illustrated in FIG. 3 to filter the molecular ions 213.

Figure 5:
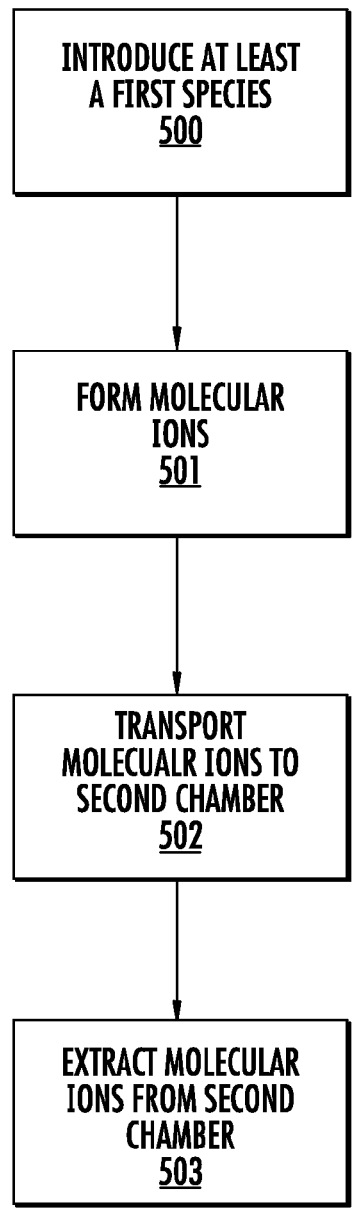
FIG. 5 is a flowchart of a method of molecular ion generation.

FIG. 5 is a flowchart of a method of molecular ion generation. At least a first species is introduced 500. This first species is ionized and combines to form molecular ions 501. The molecular ions are transported to a second chamber 502 and extracted from the second chamber 503. Of course, other gases may be introduced or a first species and second species may be combined to form molecular ions. In another embodiment, more than two species are introduced to form molecular ions. Of course, it is possible that molecular ions 213 may be generated and extracted without passing through the second chamber.

Figure 7:
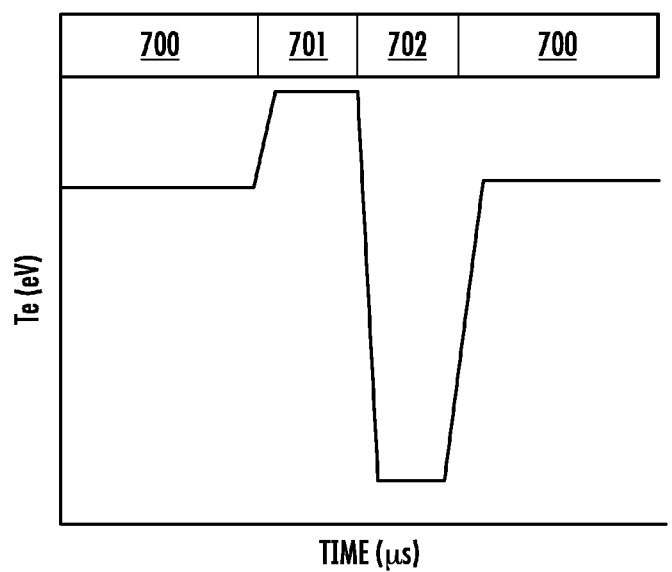
FIG. 7 is an example of electron temperature modulation using pulsing.

FIG. 7 is an example of electron temperature modulation using pulsing. Pulsing affects electron temperature and, consequently, will modify the reaction rates in the plasma that forms the molecular ions 213. Electron temperature (Te) may be modulated less than approximately 20 eV in one particular embodiment. As seen in FIG. 7, three time periods are illustrated during the pulsing. These include low power period 700, high power period 701, and off period 702. The low power period 700 may operate at approximately 750 W in one instance. The electron temperature varies as the pulsing operates in the low power period 700, high power period 701, and off period 702. Varying the pulse periods or bias during the pulse may result in different electron temperatures, which may enable different reactions that form the molecular ions 213 to occur. In one embodiment, 25% RF on at 155 Hz frequency may be used with between 1% and 95% duty cycle.

FIG. 8 is molecular ion formation from $CH_4$ using an embodiment disclosed herein. The result in FIG. 8 may use the embodiments seen in FIGS. 2-3. $C_2H_x^+$, $C_3H_x^+$, and $C_4H_x^+$ may be formed from the $CH_4$ as seen in FIG. 8. Furthermore, even larger molecules like $C_5H_x^+$, $C_6H_x^+$, or $C_7H_x^+$ may be formed. Using the embodiments disclosed herein the dominant ion formed from $CH_4$ may be $C_3H_x^+$. This may be because the electron energy is higher and the formation rate of $C_3H_x^+$ is lower compared to other reactions that may occur in the plasma or compared to the formation of $CH_x^+$ using electron impact ionization. Thus, using the embodiments disclosed herein may increase the atomic mass of the molecular ions 213 that are formed. The molecular ions 213 may be subsequently mass analyzed to select a particular ion or the parameters may be configured to form the desired ion.

The molecular ions 213 may be used for multiple applications. These include doping of a workpiece, strain modification of a workpiece, or other material modification of the workpiece. This material modification may include, for example, amorphization or damage engineering of a workpiece. Molecular ions 207 also may be used for ultra-shallow junctions (USJ), to manufacture low k dielectrics, to fabricate optical coatings, or for implanting workpieces with three-dimensional surface structures.

Embodiments of the ion source disclosed herein have multiple benefits. First, it may enable molecular ion production with fewer atomic ions generated or with less dissociation of the molecular ions into atomic ions. Second, deposits from ionization may be reduced. This will increase uptime and lower the frequency of preventative maintenance. Third, cheaper, more common species may be used to form more expensive, uncommon molecular ions. This may reduce material costs.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method to generate molecular ions comprising:
    ionizing an alkane species having a formula $C_aH_b$ in an RF ion source at a first pressure;
    generating molecular ions having a formula $C_xH_y$ in said RF ion source from said alkane species, wherein $x>a$;
    transporting said molecular ions from said RF ion source to a second ion source through a plasma pipe, wherein the second ion source is maintained at a second pressure lower than said first pressure and wherein the plasma pipe has one of solenoid and a plurality of ring magnets;
    extracting said molecular ions from said second ion source; and
    implanting said molecular ions into a workpiece after said extracting.

2. The method of claim 1, further comprising filtering said molecular ions during said transporting.

3. The method of claim 1, wherein said extracting said molecular ions occurs at a pressure lower than said first pressure.

4. The method of claim 1, wherein said ionizing said alkane species comprises applying an RF pulse and further comprising modulating an RF parameter selected from a group consisting of frequency, power, and duty cycle to modify an electron temperature during said RF pulse.

5. The method of claim 1, further comprising modifying a temperature of a surface of said second ion source to reduce deposition within said second ion source.

* * * * *